US012255070B2

(12) United States Patent
Lu et al.

(10) Patent No.: US 12,255,070 B2
(45) Date of Patent: Mar. 18, 2025

(54) SEMICONDUCTOR DEVICES AND METHODS OF MANUFACTURING

(71) Applicant: TAIWAN SEMICONDUCTOR MANUFACTURING COMPANY, LTD., Hsinchu (TW)

(72) Inventors: Min-Hsuan Lu, Hsinchu (TW); Kan-Ju Lin, Kaohsiung (TW); Lin-Yu Huang, Hsinchu (TW); Sheng-Tsung Wang, Hsinchu (TW); Hung-Yi Huang, Hsinchu (TW); Chih-Wei Chang, Hsinchu (TW); Ming-Hsing Tsai, Chu-Pei (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 673 days.

(21) Appl. No.: 17/491,161

(22) Filed: Sep. 30, 2021

(65) Prior Publication Data
US 2022/0367194 A1 Nov. 17, 2022

Related U.S. Application Data

(60) Provisional application No. 63/188,960, filed on May 14, 2021.

(51) Int. Cl.
*H01L 21/285* (2006.01)
*C23C 16/42* (2006.01)
*H01L 29/40* (2006.01)

(52) U.S. Cl.
CPC ........ *H01L 21/28518* (2013.01); *C23C 16/42* (2013.01); *H01L 29/401* (2013.01)

(58) Field of Classification Search
None
See application file for complete search history.

(56) References Cited

U.S. PATENT DOCUMENTS

| | | |
|---|---|---|
| 8,796,666 B1 | 8/2014 | Huang et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | JangJian et al. |
| 9,882,023 B2 | 1/2018 | Lin et al. |
| 2013/0127058 A1* | 5/2013 | Lavoie .............. H01L 23/53261 257/E21.585 |

(Continued)

*Primary Examiner* — Robert K Carpenter
(74) *Attorney, Agent, or Firm* — STUDEBAKER BRACKETT PLLC (57) ABSTRACT

In a semiconductor structure, a first conductive feature is formed in a trench by PVD and a glue layer is then deposited on the first conductive feature in the trench before CVD deposition of a second conductive feature there-over. The first conductive feature acts as a protection layer to keep silicide from being damaged by later deposition of metal or a precursor by CVD. The glue layer extends along the extent of the sidewall to enhance the adhesion of the second conductive features to the surrounding dielectric layer.

20 Claims, 8 Drawing Sheets

(56) References Cited

U.S. PATENT DOCUMENTS

| | | | |
|---|---|---|---|
| 2016/0043035 A1* | 2/2016 | Lin | H01L 21/76802 438/653 |
| 2016/0181386 A1* | 6/2016 | Chi | H01L 21/32136 438/585 |
| 2020/0118935 A1* | 4/2020 | Lee | H01L 21/76883 |

* cited by examiner

SEMICONDUCTOR DEVICES AND METHODS OF MANUFACTURING

CROSS-REFERENCE TO RELATED APPLICATIONS

This application claims priority under 35 U.S.C. § 119(e) to U.S. Provisional Patent Application Ser. No. 63/188,960 entitled "CONTACT PLUG WITH PVD METAL PRE CAPPING AND GLUE LAYER TO REDUCE SILICIDE DAMAGE AND ENHANCE ADHESION" filed on May 14, 2021, the entirety of which is hereby incorporated by reference.

BACKGROUND

Integrated circuits (ICs) are often designed with active devices, such as transistors, resistors and capacitors connected by conductive traces, such as metal lines and polysilicon lines, to form circuits. The active devices in ICs are formed by a photolithographic process that includes the use of photoresists, photolithographic masks (masks), specialized light sources and various etchants. Increasingly dense ICs have numerous benefits in terms of speed, functionality and cost, but cause increasingly difficult design and fabrication problems. With a decrease of dimensions of semiconductor devices, low resistance contacts have been widely utilized for fabricating, e.g., source/drain contacts arranged closer to gate structures in a field effect transistor (FET).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and also includes embodiments in which additional features are formed between the first and second features, such that the first and second features are not in direct contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the Figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure describes three-dimensional semiconductor structures shown in cross-section. In some embodiments, the semiconductor substrate is a semiconductor wafer, such as a silicon wafer or other type of wafer to be patterned. Certain embodiments describe the exemplary manufacturing process of one or more semiconductor devices. The semiconductor device may be formed on bulk silicon substrates in certain embodiments. The semiconductor device may be formed on silicon-on-insulator (SOI) substrates in alternate embodiments. Also, in accordance with some embodiments, the silicon substrate may include other conductive layers or other semiconductor device elements, such as transistors, diodes and the like that may not be explicitly shown. Accordingly, the embodiments described herein are not limited to the structures as shown.

As illustrated in the Figures and described herein, in various embodiments, the semiconductor device 100 is a field effect transistor (FET) such as a planar FET or a FinFET. In other implementations, semiconductor device 100 is one or more other types of devices such as a vertical gate all around (VGAA) FET, a horizontal gate all around (HGAA) FET, a bipolar junction transistor (BJT), a diode, a capacitor, an inductor, a resistor, and the like. In embodiments involving planar FETs and/or FinFETs, gates are formed on active areas of a semiconductor substrate. In some embodiments, the active areas are a portion at a top surface of the semiconductor substrate delineated by isolation regions. In some FinFET embodiments, the active areas are three-dimensional fins protruding between isolation regions on the semiconductor substrate. In various embodiments, the semiconductor substrate is a bulk semiconductor substrate, a semiconductor-on-insulator (SOI) substrate, or another substrate. In various embodiments, the semiconductor material of the semiconductor substrate is doped or un-doped, such as with a P-type or an N-type dopant. Other substrates, such as a multi-layered or gradient substrate may also be used in various embodiments. In some embodiments, the semiconductor material of the semiconductor substrate may include an elemental semiconductor like silicon (Si) (e.g., crystalline silicon, like Si<100> or Si<111>) and germanium (Ge); or a compound semiconductor including silicon carbide (SiC), gallium arsenide (GaAs), gallium phosphide (GaP), indium phosphide (InP), indium arsenide (InAs), and/or indium antimonide (InSb); or an alloy semiconductor including SiGe, GaAsP, aluminum indium arsenide (AlInAs), AlGaAs, GaInAs, GaInP, or GaInAsP or a combination thereof. The various layers of the semiconductor device 100 combine to form various IC features such as an active region of a transistor, a gate electrode, a source, a drain, metal lines, vias (i.e., of an interlayer interconnection), and openings for bonding pads, to be formed in a semiconductor substrate (such as a silicon wafer) and various material layers disposed on the semiconductor substrate. In the present disclosure a "source/drain" refers to a source, a drain or both source and drain, and a source and a drain are interchangeable. In the present disclosure, the metal materials (e.g., W, Ru, etc.) have a purity more than 99% and may contain unavoidable impurities.

Figure 1:
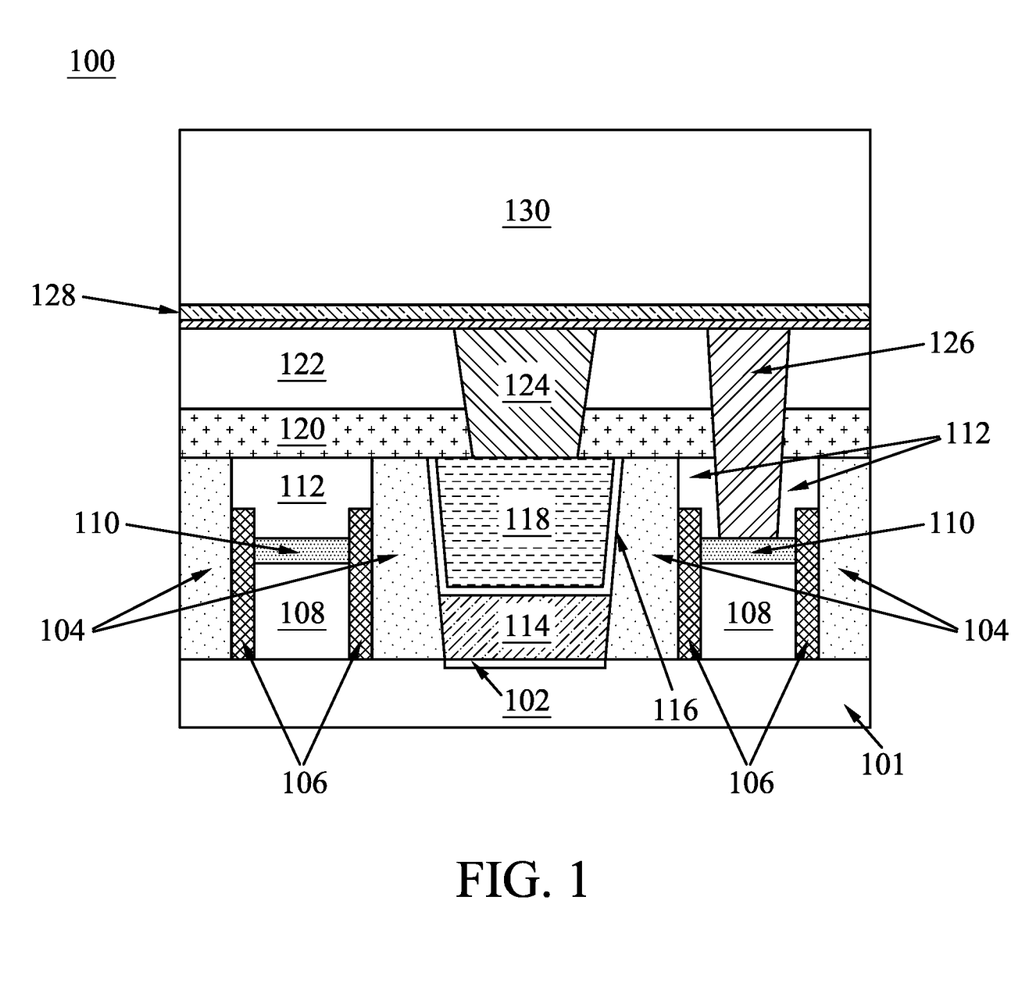
FIG. 1 is a cross-sectional view of a manufactured semiconductor device in accordance with some embodiments.

Metallic silicides are used as contact materials on source/drains and gates in a variety of metal oxide semiconductor (MOS) structures, such as transistors or memories. They are fabricated by a reaction between a metal or a metallic alloy thin film and the Si substrate in various embodiments. As shown in FIG. 1, the semiconductor device 100 includes a silicide layer 102 disposed or formed over a source/drain epitaxial layer (not shown). In some embodiments, the substrate 101 includes a fin structure. In various embodiments, the silicide material of the silicide layer 102 is nickel silicide, magnesium silicide, platinum silicide, titanium silicide, tantalum silicide, tungsten silicide, or molybdenum silicide, or any material of like properties. A thickness of the silicide layer 102 is between about 1 and about 20 nanometers (nm) in various embodiments.

In various embodiments, a gate dielectric layer 107 is disposed over the substrate 101 and a gate metal (MG) layer 108 is disposed over the gate dielectric layer 107. In some embodiments, the gate dielectric layer 107 is formed of silicon oxide. In other embodiments, the gate dielectric layer is formed of a high-k dielectric material. In some embodiments, a cross-section of the gate metal layer 108 is substantially square. In some embodiments, a cross-sectional view of the gate metal layer 108 is substantially rectangular or trapezoidal. In some embodiments, a material of the gate metal layer 108 includes titanium, $Ti_xAl_y$, $Ti_xAl_yC_z$, $Ti_xAl_yN_z$, $Ta_xC_yN_z$, $Ti_xN_y$, $W_xN_y$, tungsten, combinations thereof or any other suitable conductive material. In some embodiments, the gate metal layer 108 may be formed by performing one or more of ALD, PVD, CVD, or other suitable process. In some embodiments, the completed gate structure may be a buried gate or dummy gate according to design requirements. In other embodiments, the completed gate structure may be a gate contact pad that allows electrical conduction under various operating conditions. In various embodiments, more than two gate structures as shown are formed in the semiconductor device, such as 2, 4 or more gate structures. In various embodiments, various gate structures formed in the semiconductor device 100 may have the same or dissimilar construction according to design requirements.

In various embodiments, the gate structures can be applied in P-channel field-effect devices, N-channel field-effect devices, or both based on design requirements. Each gate structure may include a single-layer or multi-layer configurations (not shown), including one or more of an interfacial layer, a high-k layer, a work function layer, a blocking layer, an adhesion layer, and a metal filling layer. In various embodiments, the material used to form the gate structures include one or more of titanium (Ti), silver, aluminum, $Hf_xO_y$, $Al_xTi_yC_z$, $Al_xTi_yO_z$, $Al_xTi_yN_z$, $Al_xTi_yC_z$, $Al_xTi_yO_z$, $Ti_xAl_yN_z$, $Ta_xC_y$, $Ta_xC_yN_z$, $Ta_xSi_yN_z$, manganese, zirconium (Zr), $Ti_xN_y$, $Ta_xN_y$, ruthenium, molybdenum (Mo), $W_xN_y$, copper, tungsten, or any other suitable material.

In various embodiments, a cap layer 110 is next formed over the gate metal layer 108. In various embodiments, the cap layer 110 provides conductivity to and protects the underlying gate metal layer 108. In some embodiments, a material of the cap layer 110 includes aluminum (Al), tungsten (W), copper (Cu), combinations thereof or any other suitable conductive material. In some embodiments, a height of the gate metal layer 108 and the conductive cap layer 110 deposited thereon ranges between about 14 and about 22 nm.

In various embodiments, a spacer 106 is conformally disposed over the gate metal layer 108, the gate dielectric layer 107, and substrate 101. The spacer 106 is subsequently anisotropically etched to remove the horizontally extending portions and leave the vertically oriented portions extending alongside the gate metal layer 108 and gate dielectric layer 107 to form a gate structure or the like. In some embodiments, the spacer 106 protects against electric shorting between the gate structure formed therein and any adjacent gates or source/drains. In some embodiments, in the gate structure, the spacer 106 is a single-layer structure. In alternate embodiments, the spacer 106 is a multiple-layer structure, including one or more oxide layers and one or more nitride layers, such as an oxide-nitride-oxide (ONO) arrangement. In some embodiments, the material of the spacer 106 includes $Si_xO_y$, silicon nitride, $Si_xO_yN_z$, $Si_xC_yN_z$, $Si_wO_xC_yN_z$ or other suitable material. In some embodiments, the spacer 106 has a height in the range of about 1 to about 25 nm, such as about 4 nm to about 12 nm. In some embodiments, a cross-section view of the walls of the spacer 106 is substantially rectangular. In some embodiments, the method of forming the spacer 106 may include a deposition process followed by an etching process. In such embodiments, the deposition process may include ALD, molecular beam deposition (MBD), CVD, PVD, flowable chemical vapor deposition (FCVD), or a combination thereof. In such embodiments, the etching process may include an anisotropic etching process or other suitable process. One skilled in the art will readily appreciate that each of the two spacers 106 shown in cross-section on either side of a gate metal layer 108 are merely artifacts of the cross-sectional view depicted in the Figures. In various embodiments, each such pair of spacers 106 are actually opposing vertical or near-vertical edges of a continuous single spacer 106 which surrounds and encloses the gate metal layer 108 and other layers in the three-dimensional semiconductor device 100.

In some embodiments, the cap layer 100 is subsequently recess etched below the top of the spacers, and a gate helmet layer 112 is next disposed over the cap layer 112. In various embodiments, the gate helmet layer 112 is made of an insulating material to form a completed gate structure. In some embodiments, the gate helmet layer 112 is a self-aligned dielectric layer formed over the cap layer 110. In various embodiments, the gate helmet layer 112 is configured to protect underlying features of the gate structure during subsequent processing steps. In some embodiments, the gate helmet layer 112 is a sacrificial layer for forming self-aligned contacts. In some embodiments, the gate helmet layer 112 includes $Si_xN_y$, $Si_xO_y$, $Si_xC_y$, $Si_xO_yN_z$, $Si_xO_yC_z$, $Si_xC_yN_z$, $Si_wO_xC_yN_z$, $Al_xO_y$, $Al_xO_yN_z$, $Zr_xO_y$, $Zr_xN_y$, amorphous silicon, or other suitable material. In some embodiments, the gate helmet layer 112 has a thickness between about 5 nm and 200 nm. In some embodiments, the gate helmet layer 112 is T-shaped and the spacers 106 extend from a bottom of the dielectric layer 104 to a bottom surface of the arms of the T formed by the gate helmet layer 112. In some embodiments, the walls of the spacer 106 extend beyond the bottom surface of the gate helmet layer 112 but do not extend beyond the top surface of the gate helmet layer 112. Two exemplary gate structures are shown in FIG. 1 on either side of the central source/drain structure described immediately below.

In various embodiments, a dielectric layer 104 is disposed over the gate structures and the silicide layer 102. In some embodiments, the dielectric layer 104 is subsequently planarized, such as by chemical-mechanical polishing to planarize the dielectric layer 104. In some embodiments, the planarized dielectric layer 104 is substantially even with the top of the gate helmet layer 112. In some embodiments, a dielectric material of the dielectric layer 104 is an oxide, a silicon nitride ($Si_3N_4$), a silicon oxynitride ($SiO_xN_y$) or any other suitable dielectric material. In other embodiments, a dielectric material of the dielectric layer 104 is silicon dioxide ($SiO_2$), SiOCH, borophosphosilicate glass (BPSG), spin-on glass (SOG), undoped silicate glass (USG), fluorinated silicate glass (FSG), high-density plasma (HDP) oxide, fluorine-doped silicon oxide, carbon-doped silicon oxide, porous silicon oxide, porous carbon-doped silicon oxide, organic polymers, silicone based polymers, or is made from tetraethyl orthosilicate (TEOS) or plasma-enhanced TEOS (PETEOS). In some embodiments, the dielectric layer 104 includes a high-k dielectric material having a dielectric constant (k) that is greater than a dielectric constant of $SiO_2$ (which is approximately 4). In some embodiments, the high-k dielectric material includes hafnium oxide ($HfO_2$), zirconium dioxide ($ZrO_2$), yttrium oxide ($Y_xO_y$), lanthanum pentoxide ($La_2O_5$), gadolinium pentoxide ($Gd_2O_5$), titanium dioxide ($TiO_2$), tantalum pentoxide ($Ta_2O_5$), hafnium erbium oxide ($Hf_xEr_yO_z$), $Hf_xLa_yO_z$, $Hf_xY_yO_z$, $Hf_xGd_yO_z$, $Hf_xAl_yO_z$, $Hf_xZr_yO_z$, $Hf_xTi_yO_z$, $Hf_xTa_yO_z$, strontium titanium oxide ($Sr_xTi_yO_z$) or any other suitable high-k dielectric material. In some embodiments, the dielectric material is associated with a dielectric constant (k) less than about 3.9. In some embodiments, k is between about 1.5 and about 2.8. In various embodiments, the dielectric layer 104 is formed by atomic layer deposition (ALD), chemical vapor deposition (CVD), physical vapor deposition (PVD), or combinations thereof. In some embodiments, the dielectric layer 104 is etched to expose a portion or the entirety of the silicide layer 102 in order to form an electrically-connected source/drain structure thereover.

To achieve low resistance (R) of the source/drain, as is desirable in most commercial applications, low-R metal can be deposited as the source/drain metal solely by CVD. However, through detailed microscopic examination, it has been discovered that some of the precursors of CVD process induce silicide damage (e.g. via oxidation, or flourine (F) or chlorine (Cl) attack) and thus cause undesirable increased source/drain contact resistance between metal and silicide layers. This, in turn, may severely degrade the device performance.

In order to overcome such manufacturing defects, in the present embodiments, a source/drain metal (source/drain contact (MD)) is first deposited by PVD to protect the silicide layer 102 from being damaged by the deposition of the subsequent CVD-deposited low-R metal or precursor. To reduce damage to the silicide-to source/drain metal contact (MD) interface in the semiconductor device 100, in various embodiments, PVD deposition of a bottom conductive feature is first performed on the top surface of the silicide 102 before later CVD deposition of a top conductive feature that completes the source/drain structure. The damage induced by CVD metal or precursor deposition accordingly decreases and pull-up of the source/drain metal from the top surface of the silicide layer 102 is eliminated.

In various embodiments, the source/drain contact structure includes a bottom source/drain conductive feature 114 that is deposited over the silicide layer 102 by PVD. In some embodiments, the metal material of the bottom source/drain conductive feature 114 acts as a protection layer to keep silicide from being damaged by the deposition of metal (or precursor) by CVD and to avoid pull-up of the source/drain metal from the silicide layer 102. In various embodiments, the material used to form the bottom source/drain conductive feature 114 is a metal such as: W, Ru, cobalt (Co), and Mo. In some embodiments, a cross-section of the bottom source/drain conductive feature 114 is substantially square, rectangular or trapezoidal. In some embodiments, a length of the top surface of the bottom source/drain conductive feature is between about 1 to about 80 nm. In other embodiments, a length of the top surface of the bottom source/drain conductive feature 114 is between about 2 and about 40 nm. In some embodiments, a length of the bottom surface of the bottom source/drain conductive feature is between about 1 to about 80 nm. In other embodiments, a length of the bottom surface of the bottom source/drain conductive feature 114 is between about 1 and about 39 nm. In some embodiments, a thickness of the bottom source/drain conductive feature 114 is between about 1 and about 5 nm.

In various embodiments, a glue layer 116 is deposited on the top surface of the bottom source/drain conductive feature 114 and along a remaining extent of the sidewall formed for the source/drain structure, forming a U-shape cross section. In some embodiments, the glue layer 116 enhances side wall adhesion of source/drain metal later deposited by CVD and the nearby dielectric layer 104. In some embodiments, glue layer 116 enhances the adhesion of source/drain metal later deposited by CVD to the dielectric layer 104 and the bottom source/drain conductive feature 114. In various embodiments, the material of the glue layer 116 is Ru, $Ta_xN_y$, and/or $Ti_xN_y$. In some embodiments, a thickness of the glue layer 116 at the sidewall is between about 0.3 and about 5 nm. In some embodiments, a thickness of the glue layer 116 disposed on the top surface of the bottom source/drain conductive feature 114 is between about 0.3 and about 5 nm.

In various embodiments, a top source/drain conductive feature 118 is deposited on top of the glue layer 116 by CVD to complete the source/drain contact structure of the semiconductor device 100. In some embodiments, the material used to form the top source/drain conductive feature 118 is a metal such as W, Ru, Co, and Mo. In various embodiments, a cross-section of the top source/drain conductive feature 118 is substantially square, rectangular or trapezoidal. In some embodiments, a length of the top surface of the top source/drain conductive feature 118 is between about 1 nm to about 80 nm, such as about 10 nm to about 30 nm. In other embodiments, a length of the top surface of the top source/drain conductive feature 118 is between about 2 nm and about 20 nm, such as between about 15 nm and about 40 nm. In some embodiments, a length of the bottom surface of the top source/drain conductive feature 118 is between about 1 nm to about 80 nm, such as between about 15 nm and about 45 nm. In other embodiments, a length of the bottom surface of the top source/drain conductive feature 118 is between about 1 nm and about 19 nm, such as between 4 nm and about 10 nm. In some embodiments, a thickness of the top source/drain conductive feature is between about 2 and about 20 nm. In various embodiments, a ratio of the thickness of the top source/drain conductive feature 118 to the bottom source/drain conductive feature 114 is 2 to 20. In some embodiments, a ratio of the thickness of the top source/drain conductive feature 118 to the bottom source/drain conductive feature 114 is 6 to 12. In various embodiments, the top source/drain conductive feature 118, the glue layer 116 and the bottom source/drain conductive feature 114 together form a low resistance source/drain metal structure with enhanced sidewall adherence and reduced potential for pull-up of the source/drain metal from the silicide layer 102. In various embodiments, a chemical mechanical polishing (CMP) process or the like is employed to smooth and make substantially flat the top surface of the dielectric layer 104, the top surface of the gate helmet layer 112 and the top surface of the top source/drain conductive feature 118 for a continuous top transistor surface.

In various embodiments, a contact etch stop layer (CESL) 120 is deposited over the continuous top transistor surface. In some embodiments, the material for the CESL 120 includes one or more deposited layers of insulating material such as $Si_xO_y$, $Si_xC_y$, $Si_xN_y$, $Si_xO_yC_z$, $Si_xO_yN_z$, $Si_xC_yN_z$, $Ti_xN_y$, $Al_xN_y$, $Al_xO_yN_z$, hard black diamond (HBD), or the like. In some embodiments, the CESL 120 may be formed by depositing and annealing a metal oxide material, which includes Hf, $Hf_xO_y$, or Al. In some embodiments, the CESL 120 is formed using a suitable process such as ALD, CVD, PVD, molecular beam epitaxy (MBE), spin-on, or combinations thereof. In some embodiments, the CESL 120 has a thickness in a range from about 1 to about 30 nm, such as about 3 nm to about 10 nm.

In various embodiments, an inter-layer dielectric (ILD) layer 122 is disposed over the CESL 120. In some embodiments, the material of the ILD 122 is different from the material of the CESL 120. In some embodiments, the ILD 122 has a different etch selectivity from the spacer 106 and the CESL 120. In some embodiments, the material of the ILD 122 includes $Si_xO_y$, $Si_xN_y$, $Si_xO_yN_z$, $Si_wO_xC_yN_z$, $Si_xC_yN_z$ or other suitable material. In some embodiments, the method of forming the ILD 122 includes a deposition process followed by a smoothing or planarization process. In some embodiments, the deposition process includes ALD, CVD, PVD, flowable CVD (FCVD), or a combination thereof. The planarization process may include a CMP process, an etch process, or other suitable process. In some embodiments, the ILD 122 is a single-layer structure. In some alternative embodiments, the ILD 122 is a multi-layer structure. In some alternative embodiments, the ILD 122 is a multi-layer structure and has a hard mask layer as an uppermost layer. In various embodiments, the ILD is used to electrically separate closely-spaced interconnect lines arranged in several levels (multilevel metallization) as employed in advanced integrated circuit designs. In various embodiments, the CESL 120 and the ILD 122 are etched to form an opening (via hole) therethrough to expose a portion of the top source/drain conductive feature 118 and one or more openings (via holes) to expose one or more of the gate helmet layers 112 in accordance with design requirements.

In various embodiments, an upper source/drain contact material 124 is deposited in an upper source/drain contact (VD) formed through the CESL 120 and the ILD 122. In some embodiments, the source/drain contact material 124 is W, Ru, Co, Cu, Mo, $Ta_xN_y$, and/or $Ti_xN_y$. In some embodiments, a cross-section view of the source/drain contact material 124 is substantially trapezoidal. In other embodiments, a cross-section view of the upper source/drain contact material 124 is substantially square or rectangular. In some embodiments, a length of the top surface of the upper source/drain contact material 124 is between about 1 nm and about 80 nm. In some embodiments, a length of the top surface of the upper source/drain contact material 124 is between about 2 nm and about 50 nm. In some embodiments, a length of the bottom surface of the upper source/drain contact material 124 is between about 1 and about 80 nm. In some embodiments, a length of the bottom surface of the upper source/drain contact material 124 is between about 1 and about 30 nm. In various embodiments, the upper source/drain contact material 124 forms a low-resistance contact with the underlying portions of the source/drain structure.

In various embodiments, a gate contact material 126 is deposited in a gate via (VG) formed through the CESL 120 and the ILD 122 by an etching process or the like. In some embodiments, the gate contact material 126 is a metal such as W, Ru, Co, Cu, Mo, $Ta_xN_y$, and $Ti_xN_y$. In some embodiments, a cross-section of the gate contact material is substantially trapezoidal. In other embodiments, the gate contact material is substantially square, rectangular or triangular. In other embodiments, the gate contact material 126 is deposited by CVD, PVD, ALD, or FCVD. In some embodiments, the length of the top surface of the gate contact material 126 is between about 1 and about 50 nm. In some embodiments, the length of the top surface of the gate contact material 126 is between about 2 and about 20 nm. In some embodiments, the length of the bottom surface of the gate contact material is between about 1 and about 50 nm. In some embodiments, the length of the bottom surface of the gate contact material is between about 1 and about 19 nm.

In various embodiments, the gate contact material 126 forms a low-resistance contact with the underlying gate structure. In various embodiments, the source/drain and one or more gates are shorted (i.e., connected to the same voltage drop in the semiconductor device 100) according to design requirements. In some such embodiments, the source/drain and a gate are connected to avoid electrical interference with one or more other gate structures. In other embodiments, the source/drain and gates are each connected to separate signal lines of the semiconductor device 100. In some embodiments, gate contact material 126 is deposited for multiple gates, such as in a FinFET device. In various embodiments, the upper source/drain contact material 124, the gate contact material 126 and the top source/drain conductive feature 118 are composed of the same metals. In other embodiments, one or more of the upper source/drain contact material 124, the gate contact material 126 and the top source/drain conductive feature 118 are composed of the different metals. In some embodiments, a top surface of the gate contact material 126, the upper source/drain contact material 124 and the ILD 122 are smoothed or planarized, such as by CMP, to form a substantially smooth continuous top surface.

In various embodiments, a barrier layer 128 is disposed on top of the smooth continuous top surface formed by the top surfaces of the gate contact material 126, source/drain contact material 124 and the ILD 122. In some embodiments, the barrier layer 128 is a single layer structure. In other embodiments, the barrier layer 128 is a multi-layer structure, as shown in FIG. 1. In some embodiments, the material used to form the barrier layer 128 is W, Ru, Co, Cu, Mo, TaN, and/or TiN.

In various embodiments, a top metal layer (MO) 130 is disposed over the barrier layer 128. In some embodiments, the material used to form the top metal layer 130 is W, Ru, Co, Cu, Mo, TaN, TiN. In some embodiments, a thickness of the top metal layer 130 is between about 1 and about 50 nm.

FIG. 2A, FIG. 2B, FIG. 2C, FIG. 2D, FIG. 2E, and FIG. 2F show cross sectional views of various stages of the sequential fabrication process of a semiconductor device 100 according to various embodiments. The substrate 101 is not shown to simplify the description. It is understood that additional operations can be provided before, during, and after processes shown by FIGS. 2A-2F, and some of the operations described below can be replaced or eliminated, for additional embodiments of the method. The order of the operations/processes may be interchangeable.

Figure 2A:
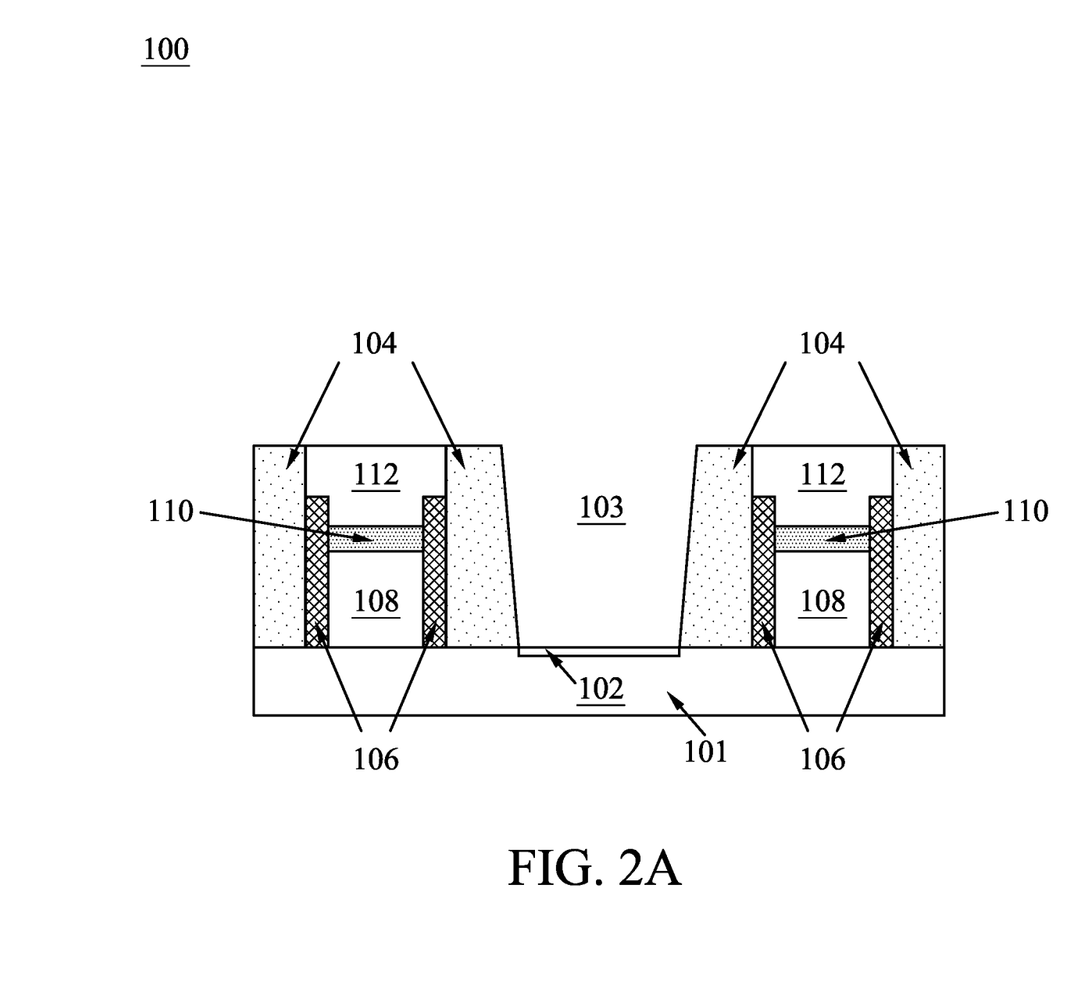
FIG. 2A, FIG. 2B, FIG. 2C, FIG. 2D, FIG. 2E, and FIG. 2F show cross-sectional views of various stages of the sequential fabrication process of a semiconductor device according to some embodiments.

FIG. 2A illustrates portions of the semiconductor device 100 that are completed, in various embodiments, in a front end of line (FEOL) process. These portions include the gate structures including the spacers 106, the gate metal layer 108, the cap layer 110 and the gate helmet layer 112 as previously described. In various embodiments, a trench 103 is formed in the dielectric layer 104 to accommodate a source/drain contact structure between two or more adjacent gate structures. In some embodiments, the trench 103 is formed by one or more lithography and etching processes to expose the underlying silicide layer 102. CMP or other planarization techniques are performed in various embodiments to smooth the tops surfaces of the gate structures and the silicide layer 102.

Figure 2B:
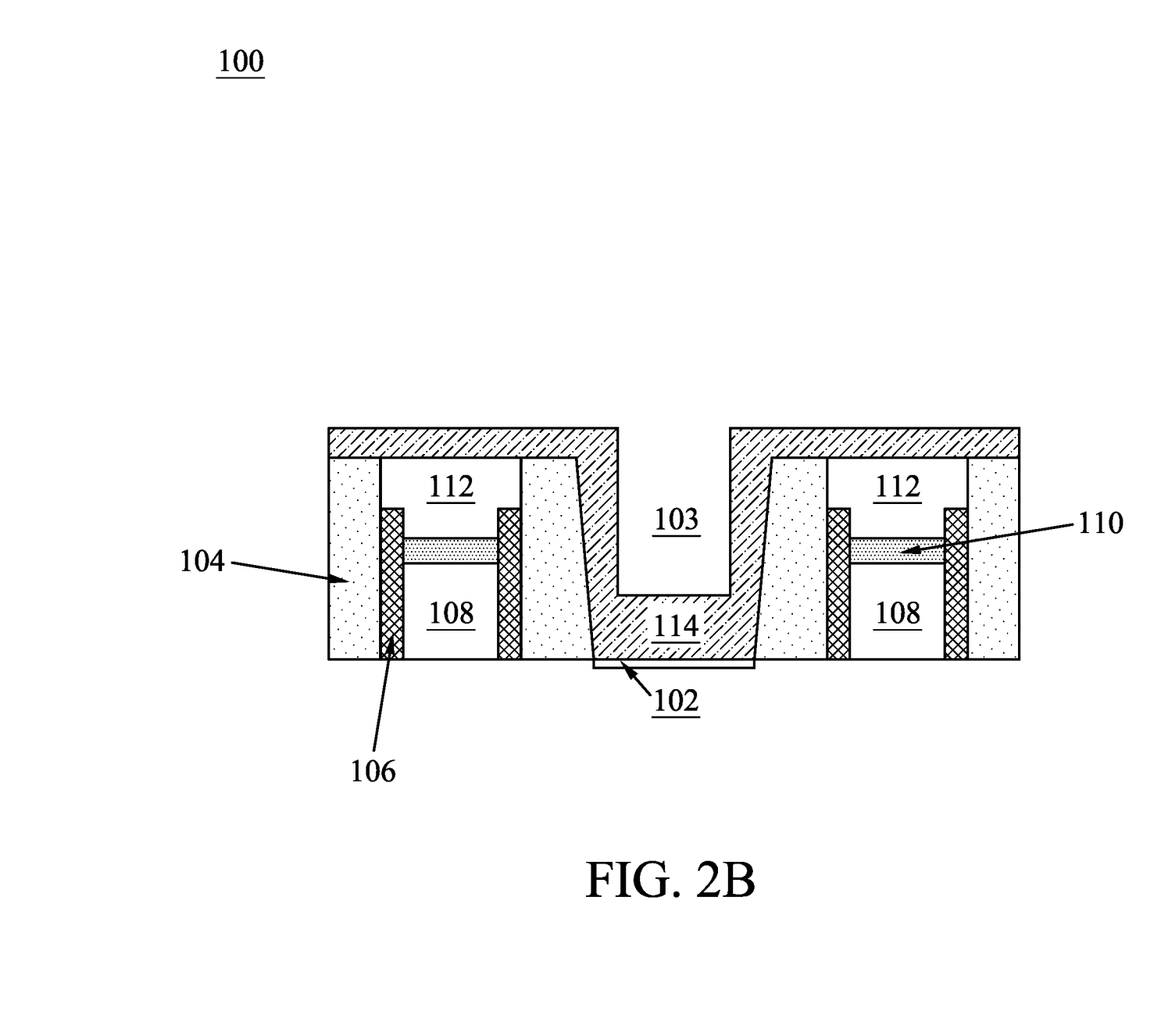

FIG. 2B illustrates the results of a subsequent deposition of a material to form the bottom source/drain conductive feature 114 over the silicide layer 102, in various embodiments. In some embodiments, the material is deposited over the gate structures, the sidewalls of the trench 103 forming the source/drain via (VD), and the top surface of the silicide layer 102. In various embodiments, the material is deposited by PVD (such as sputtering) at a temperature between about 10 degrees and about 400 degrees Celsius (C) and at a pressure between about 0.1 millitorr (mtorr) and about 1 torr.

Figure 2C:
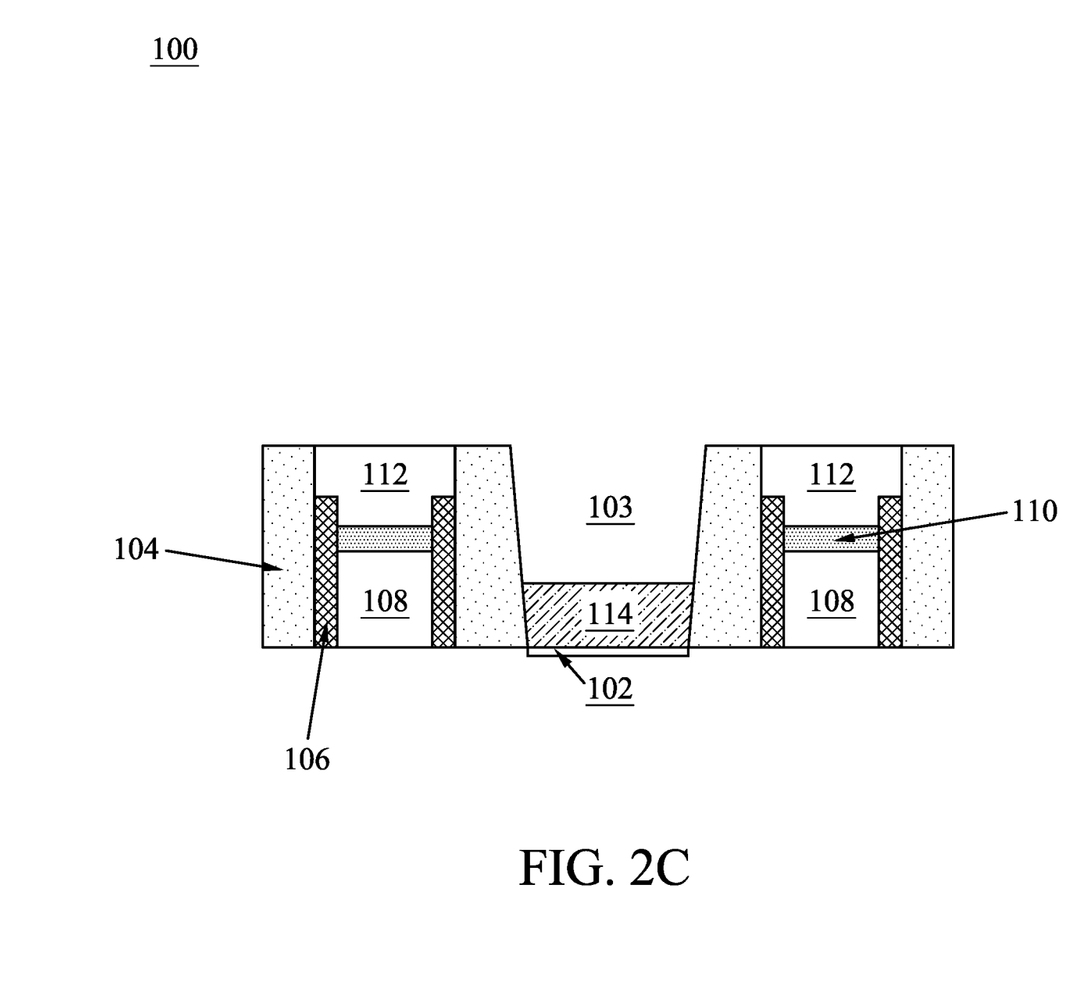

FIG. 2C illustrates the results of an etching back of the material used to form the bottom source/drain conductive feature 114 in various embodiments. This operation is performed by dry etching back or wet etch back processes in various embodiments to remove the material from the sidewalls of the trench 103 and the top surfaces of the gate structures before further manufacturing operations are performed.

Figure 2D:
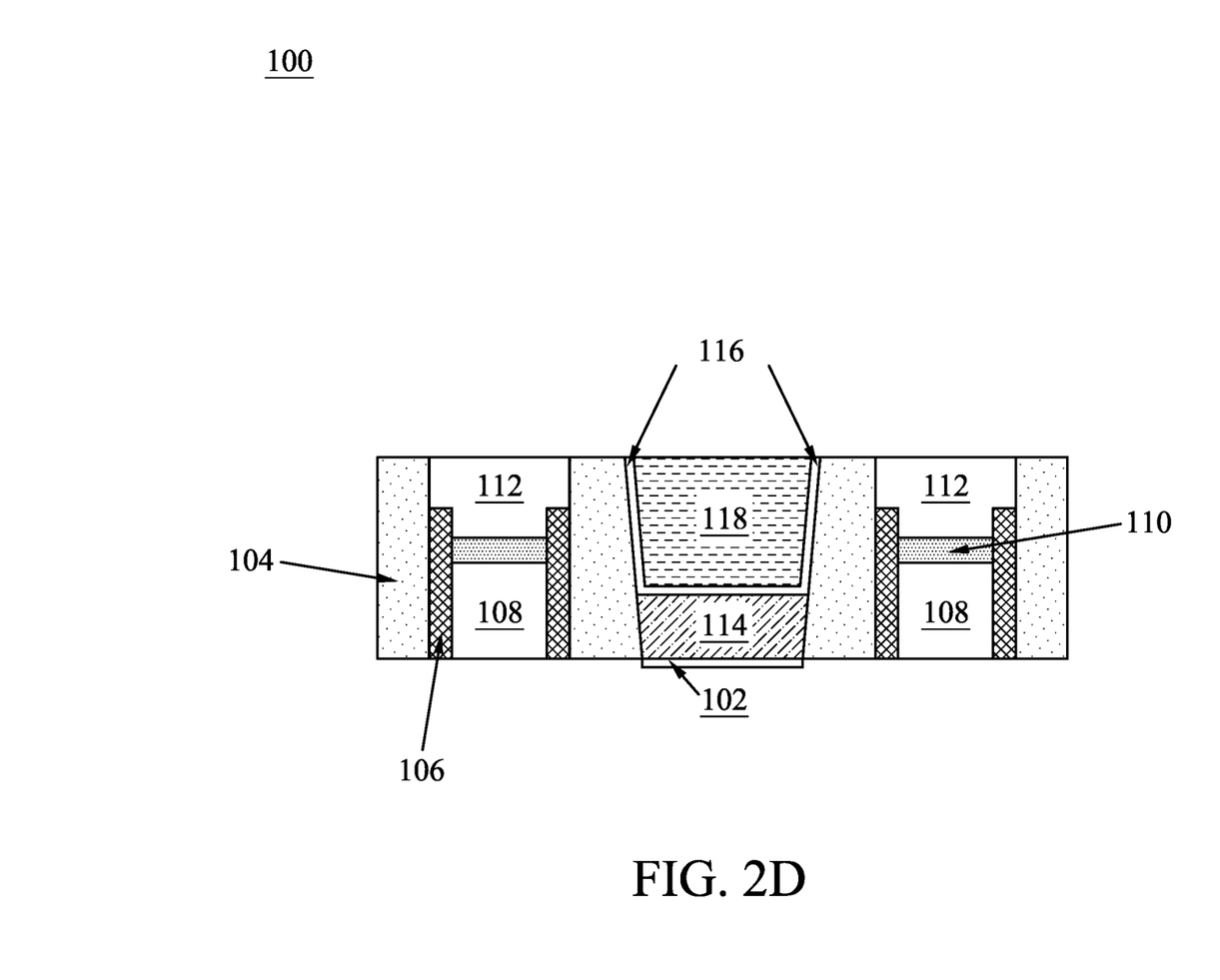

FIG. 2D illustrates the results of a follow-on deposition of the glue layer 116 over the bottom source/drain conductive feature 114 and along the sidewalls of the trench 103 followed by a CVD process to deposit the material forming the top source/drain conductive feature 118, in various embodiments. In some embodiments, the glue layer 116 is deposited by a CVD process at a temperature between about 250 and about 450 degrees C. and at a pressure between about 1 mtorr and about 1 torr. CVD deposition of the material for forming the top source/drain conductive feature 118 is next performed. In embodiments where the precursor includes Ru compounds (such as $Ru_x(CO)_y$, $Ru_x(CO)_yCl_z$, or $Ru_x(CO)_yBr_z$), the CVD process is performed at a temperature between about 50 and about 250 degrees C. and at a pressure between about 1 mtorr and about 5 torr. In embodiments where the precursor includes Co compounds (such as $C_wH_xCo_yO_z$ with or w/o $NH_3$ treatment), the CVD process is performed at a temperature between about 100 and about 200 degrees C. and at a pressure between about 1 mtorr and about 5 torr. In embodiments, where the precursor includes W compounds (such as $W_xF_y$ with or w/o $NH_3$ and/or $H_2$ treatment), the CVD process is performed at a temperature between about 250 and about 400 degrees C. and at a pressure between about 1 mtorr and about 5 torr. In embodiments where the precursor includes Mo compounds (such as $Cl_xMoO_y$ and/or $Mo_xCl_y$), the CVD process is performed at a temperature between about 50 and about 250 degrees C. and at a pressure between about 1 mtorr and about 5 torr. In some embodiments, a CMP process is then employed to smooth the glue layer 116 and the CVD formed layer 118. In various embodiments, the use of metal deposition by PVD followed by glue layer deposition thereover before metal deposition by CVD to form a source/drain structure lessens silicide damage that would be induced by CVD metal precursor where CVD is solely employed to form the source/drain structure. Enhanced adhesion of the metal deposited by CVD to nearby dielectric material forming the sidewall is also achieved by providing the glue layer 116 as shown and described.

Figure 2E:
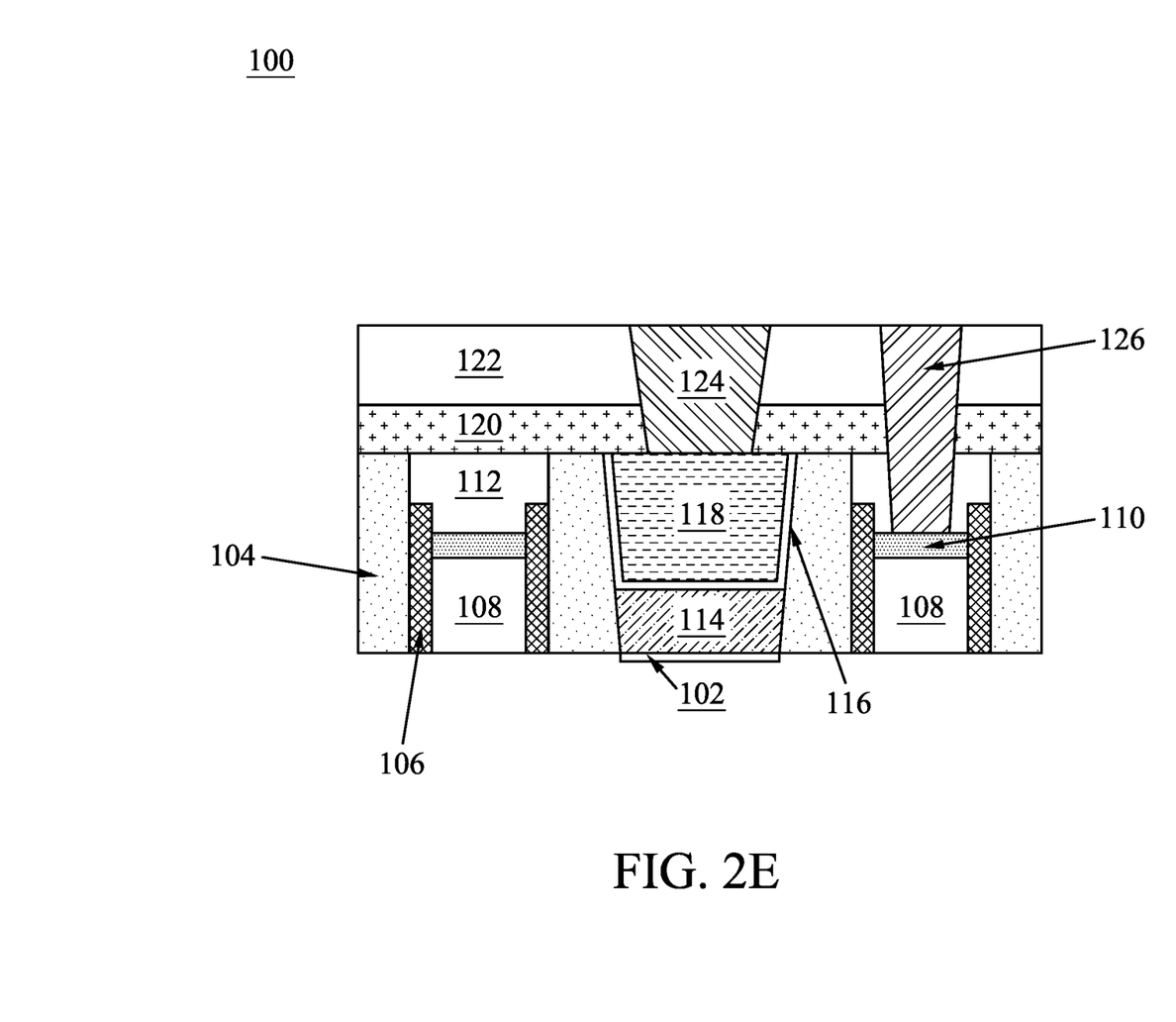

FIG. 2E illustrates the results, in various embodiments, of the deposition and etching of the CESL 120 and ILD 122 to form gate and source/drain vias over the source/drain and desired gate structures, in accordance with design requirements. In various embodiments, the CESL 120 is first deposited over the gate and source/drain structures completed above. In some embodiments, a CMP or like smoothing/planarization is then performed in some embodiments to smooth a top surface of the CESL 120. In various embodiments, the ILD 122 is then deposited on the top surface of the CESL 120, after which, an etching process or the like is performed to form vias over the source/drain structure and desired gate structures according to design requirements. In various embodiments, metal deposition is performed by CVD or the like to form the source/drain contact material 124 and gate contact material 126. In various embodiments, a CMP process is then performed to smooth and make substantially continuous the top surfaces of the ILD 122, the source/drain contact material 124 and the gate contact material 126.

Figure 2F:
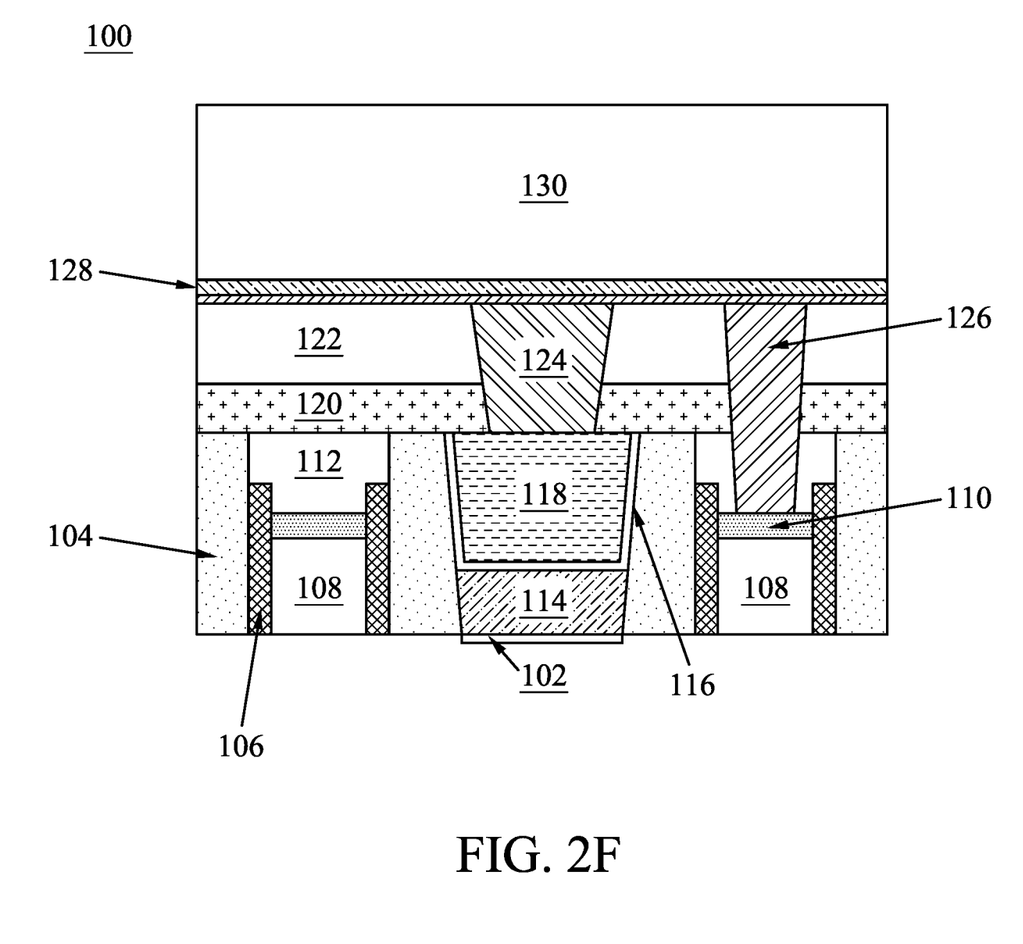

FIG. 2F shows the results of a completed semiconductor device 100 where, in various embodiments, one or more barrier layers 128 are next deposited and smoothed, followed by metal deposition of the top metal layer 130. In some embodiments, a CMP process is used to smooth the top surface of the top metal layer 130 after its deposition.

Figure 3:
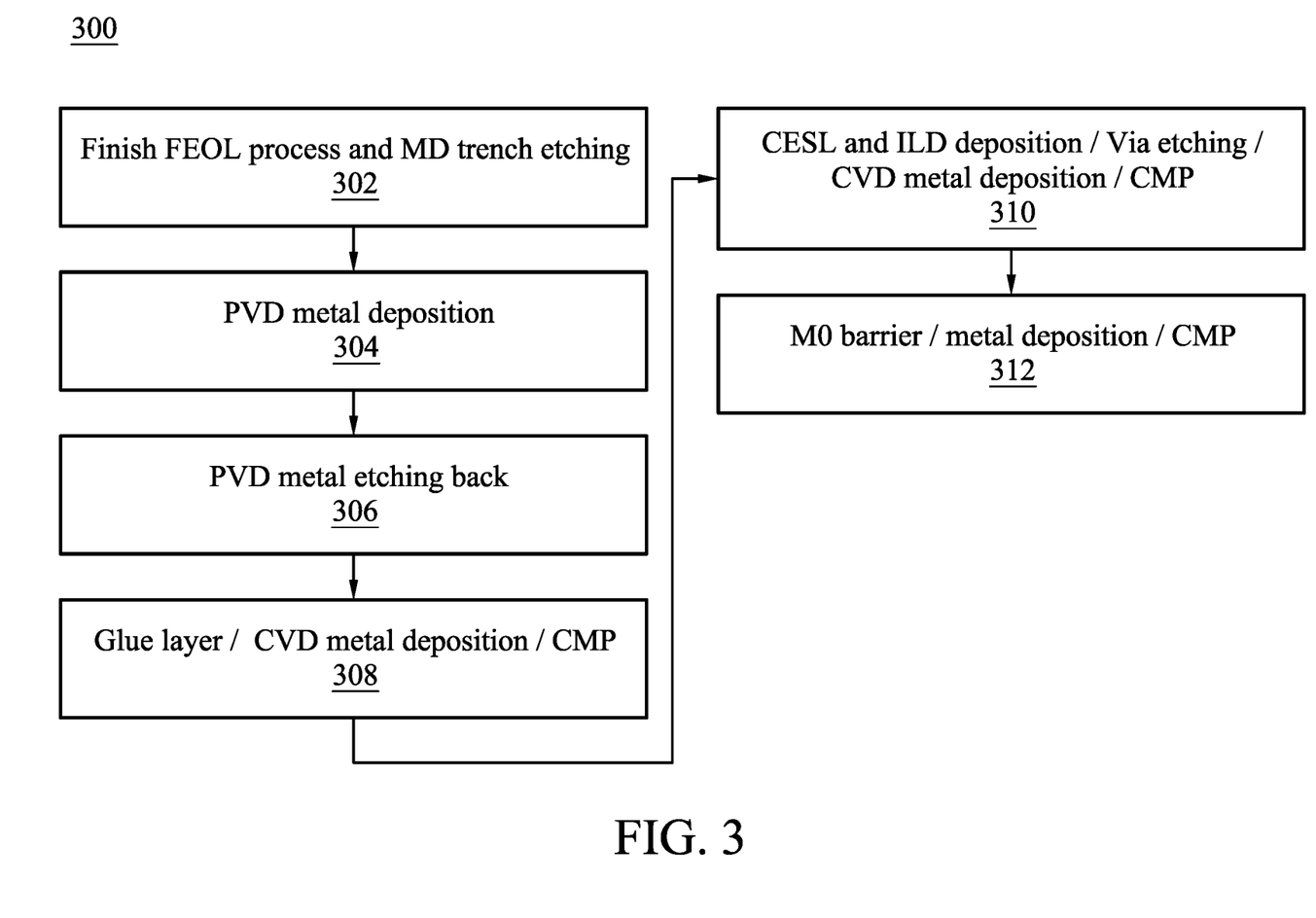
FIG. 3 is a diagram of a process for forming a semiconductor device in accordance with some embodiments.

FIG. 3 is a flowchart of a process 300 for forming the semiconductor device 100 in some embodiments.

At operation 302, the gate structures and the dielectric layer 104 are formed in a FEOL process, in some embodiments, followed by a trench etching process to form the trench 103 that will be filled with a source/drain structure.

At operation 304, a PVD metal deposition process is then performed to form the bottom source/drain conductive feature 114. In some embodiments, the PVD process is performed at a temperature between about 10 and about 400 degrees C. at a pressure between about 0.1 mtorr and about 1 torr.

At operation 306, a PVD metal etching back is performed, which is a dry etch back or a wet etch back in various embodiments.

At operation 308, the glue layer 116 is deposited over the PVD metal and the exposed dielectric layer 104 at a temperature between about 250 and about 450 degrees C. at a pressure between about 0.1 mtorr and about 1 torr in various embodiment. This is followed by CVD metal deposition of the top source/drain conductive feature 118 over the glue layer 116 in various embodiments. A top surface of the top source/drain conductive feature 118 is then polished by CMP in various embodiments.

At operation 310, CESL and ILD depositions over the top surface of the semiconductor device 100 are performed in various embodiments. This is followed by via etching over the desired gates and source/drains according to design requirements in various embodiments. CVD metal deposition of the source/drain and gate contacts is then performed in various embodiments, followed by smoothing of the gate and source/drain contacts by CMP in various embodiments.

Finally, at operation 312, deposition of the barrier layers 128 and the top metal layer are performed to complete the semiconductor device 100, in various embodiments, after which the process 300 ends.

The foregoing demonstrates various manufacturing processes where a PVD metal deposition, followed by an etching back, followed by a glue layer deposition, followed by a CVD metal deposition is used to form a low resistance source/drain structure that demonstrates superior adhesion to nearby dielectric materials and which eliminates pull-up of the source/drain metals from underlying silicide contacts and other manufacturing defects. Lower resistance and superior device performance and longevity directly result from use of embodiments of the disclosure. The disclosed process may be used in the formation of semiconductor structures other than the source/drain structures as described herein.

Aspects of some embodiments herein can be applied to FEOL, middle end of the line (MEOL) and back end of line (BEOL) processes. Conductive features 114, 118, including the processes by which the conductive features 114, 118 are formed, can implement aspects of various embodiments in FEOL, BEOL and/or MEOL processes. For example, replacement source/drain structures or stacks are formed in a similar manner according to some embodiments. For replacement gate stacks, for example, conformal layers, such as a dielectric layer and/or work-function tuning layer(s), which are formed where a dummy gate stack is removed, can be deposited. In other examples, aspects of the foregoing can be incorporated in conductive features formed in intermetallization dielectrics (IMDs) in BEOL processing. The methods and structures disclosed herein are useful for a wide variety of Si process manufacturing, packaging, and assembly as well as by etching and plating tool vendors and suppliers. The methods and structures herein are particularly useful in advanced FinFET processes, including WLP/InFO (wafer level packaging/integrated fan-out).

This disclosure introduces methods and resulting structures employing PVD metal deposition and glue layer deposition before CVD metal deposition to form a source/drain structure, which lessens silicide damage that is induced by CVD metal precursors.

According to various embodiments, a method for forming a semiconductor device structure includes: (i) performing a deposition process to form a silicide layer; (ii) performing a deposition process to form a dielectric layer over the silicide layer; (iii) performing an etching process to form an opening in the dielectric layer that exposes the silicide layer, the opening having a sidewall; (iv) performing a physical deposition process to form a first conductive feature over the silicide layer; (v) performing a deposition process to form a glue layer that extends along the sidewall above the first conductive feature to a top surface of the dielectric layer and along a top surface of the first conductive feature; and (vi) performing a chemical deposition process to form a second conductive feature in the opening and in contact with the glue layer disposed along the sidewall and the top surface of the first conductive feature, such that the second conductive feature extends to the top surface of the dielectric layer. In some embodiments, the method further includes: (i) performing a chemical mechanical polishing process to smooth and even the top surface of the dielectric layer and the top surface of the second conductive feature; (ii) performing a deposition process to form a contact etch stop layer over the dielectric layer and the second conductive feature; (iii) performing a deposition process to form an interlayer dielectric over the contact etch stop layer; and (iv) performing an etching process to form a via extending through the contact etch stop layer and the interlayer dielectric to expose a portion of the top surface of the second conductive feature. In some embodiments, a ratio of a thickness of the second conductive feature to a thickness of the first conductive feature is between 2 and 20. In some embodiments, a thickness of the silicide layer is between about 1 nm and about 20 nm. In some embodiments, a thickness of the first conductive feature is between about 1 nm and about 5 nm. In some embodiments, a thickness of the glue layer is 1 nm or less.

According to various embodiments, a method for forming a semiconductor device structure includes: (i) forming a silicide layer; (ii) forming a dielectric layer over the silicide layer; (iii) etching a trench in the dielectric layer to expose the silicide layer, the trench having a sidewall; (iv) performing a physical vapor deposition process to form a first conductive feature over the silicide layer within the trench; (v) forming a glue layer that continuously extends along the sidewall above the first conductive feature to a top surface of the dielectric layer and along a top surface of the first conductive feature; and (vi) performing a chemical deposition process to form a second conductive feature in the trench and in contact with the glue layer, such that the second conductive feature extends to the top surface of the dielectric layer. In some embodiments, the first conductive feature and the second conductive feature are formed of same materials. In some embodiments, the first conductive feature and the second conductive feature are comprised of different materials. In some embodiments, the dielectric layer extends from the top surface of the silicide layer to a top surface of the second conductive feature. In some embodiments, the glue layer is further disposed along a wall of the trench between the second conductive feature and the dielectric layer, and extends along the top surface of the dielectric layer. In some embodiments, the top surface of the first conductive feature and a bottom surface of the first conductive feature have widths within 1 nm of each other. In some embodiments, a width of a top surface of the second conductive feature and a width of a bottom surface of the second conductive feature are within 2 nm of each other. In some embodiments, the width of the top surface of the second conductive feature is greater than the width of the bottom surface of the second conductive feature.

According to various embodiments, a semiconductor structure includes a silicide layer disposed over a substrate. In such embodiments, a dielectric layer is disposed above and around the silicide layer. In such embodiments, the dielectric layer has a trench for exposing at least a portion of the silicide layer. In such embodiments, a first conductive feature is disposed on a top surface of the silicide layer within the trench and is deposited by a physical vapor deposition process. In such embodiments, a glue layer is disposed on a top surface of the first conductive feature within the trench. In such embodiments, a second conductive feature is disposed on a top surface of the glue layer and is deposited by a chemical vapor deposition process. In some embodiments, the silicide layer is made of nickel silicide, magnesium silicide, platinum silicide, titanium silicide, tantalum silicide, tungsten silicide, or molybdenum silicide. In some embodiments, the dielectric layer is made of silicon dioxide, silicon nitride, silicon oxynitride, or silicon carbon nitride. In some embodiments, the first conductive feature and the second conductive feature are made of tungsten, ruthenium, cobalt or molybdenum. In some embodiments, the glue layer is made of ruthenium, tantalum nitride or titanium nitride. In some embodiments, the silicide layer does not extend under the dielectric layer past the overlying trench.

The foregoing outlines features of several embodiments or examples so that those skilled in the art better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   performing a deposition process to form a silicide layer;
   performing a deposition process to form a dielectric layer over the silicide layer;
   performing an etching process to form an opening in the dielectric layer that exposes the silicide layer, the opening having a sidewall;
   performing a physical deposition process to form a first conductive feature over the silicide layer;
   performing a deposition process to form a glue layer that extends along the sidewall above the first conductive feature to a top surface of the dielectric layer and along a top surface of the first conductive feature;
   performing a chemical deposition process to form a second conductive feature in the opening and in contact with the glue layer disposed along the sidewall and the top surface of the first conductive feature, the second conductive feature extending to the top surface of the dielectric layer; and
   performing a deposition process to form a contact etch stop layer directly over a portion of an uppermost surface of the second conductive feature.

2. The method of claim 1, further comprising:
   performing a chemical mechanical polishing process to smooth and even the top surface of the dielectric layer and the top surface of the second conductive feature;
   performing a deposition process to form an interlayer dielectric over the contact etch stop layer; and
   performing an etching process to form a via extending through the contact etch stop layer and the interlayer dielectric to expose a portion of the top surface of the second conductive feature,
   wherein the contact etch stop layer is formed over the dielectric layer.

3. The method of claim 1, wherein a ratio of a thickness of the second conductive feature to a thickness of the first conductive feature is between 2 and 20.

4. The method of claim 1, wherein a thickness of the silicide layer is between about 1 and 20 nanometers (nm).

5. The method of claim 1, wherein a thickness of the first conductive feature is between about 1 and 5 nm.

6. The method of claim 1, wherein a thickness of the glue layer is 1 nm or less.

7. A method for forming a semiconductor device structure, comprising:
   forming a silicide layer;
   forming a dielectric layer over the silicide layer;
   etching a trench in the dielectric layer to expose the silicide layer, the trench having a sidewall;
   performing a physical vapor deposition process to form a first conductive feature over the silicide layer within the trench;
   forming a glue layer that continuously extends along the sidewall above the first conductive feature to a top surface of the dielectric layer and along a top surface of the first conductive feature;
   performing a chemical deposition process to form a second conductive feature in the trench and in contact with the glue layer, the second conductive feature extending to the top surface of the dielectric layer; and
   performing a deposition process to form a contact etch stop layer directly over a portion of an uppermost surface of the second conductive feature.

8. The method of claim 7, wherein the first conductive feature and the second conductive feature are formed of same materials.

9. The method of claim 7, wherein the first conductive feature and the second conductive feature are comprised of different materials.

10. The method of claim 7, wherein the dielectric layer extends from the top surface of the silicide layer to a top surface of the second conductive feature.

11. The method of claim 10, wherein the glue layer is further disposed along a wall of the trench between the second conductive feature and the dielectric layer, and extends along the top surface of the dielectric layer.

12. The method of claim 7, wherein the top surface of the first conductive feature and a bottom surface of the first conductive feature have widths within 1 nm of each other.

13. The method of claim 7, wherein a width of a top surface of the second conductive feature and a width of a bottom surface of the second conductive feature are within 2 nm of each other.

14. The method of claim 13, wherein the width of the top surface of the second conductive feature is greater than the width of the bottom surface of the second conductive feature.

15. A method of manufacturing a semiconductor device, comprising:
   disposing a silicide layer over a substrate;
   disposing a dielectric layer over the silicide layer, forming a trench in the dielectric layer to expose at least a portion of the silicide layer;
   depositing a lower metal source/drain feature on an upper surface of the silicide layer within the trench;
   disposing a metal adhesive layer on an upper surface of the lower metal source/drain feature and side surfaces of the trench;
   depositing an upper metal source/drain feature on an upper surface of the metal adhesive layer;
   disposing a contact etch stop layer directly over a portion of an uppermost surface of the upper metal source/drain feature; and
   disposing a source/drain contact over the upper metal source/drain feature.

16. The method according to claim 15, wherein the silicide layer comprises nickel silicide, magnesium silicide, platinum silicide, titanium silicide, tantalum silicide, tungsten silicide, or molybdenum silicide.

17. The method according to claim 16, wherein a thickness of the silicide layer is between 1 and 20 nanometers (nm).

18. The method according to claim 15, wherein the metal adhesive layer comprises at least one of ruthenium, tantalum nitride, and titanium nitride.

19. The method according to claim 15, wherein an upper surface of the silicide layer is level with an upper surface of the substrate.

20. The method according to claim 15, wherein the lower metal source/drain feature and the upper metal source/drain feature are formed of same materials.

* * * * *